United States Patent
Puthenthermadam et al.

(10) Patent No.: US 12,430,046 B2
(45) Date of Patent: Sep. 30, 2025

(54) EARLY PROGRAM TERMINATION WITH ADAPTIVE TEMPERATURE COMPENSATION

(71) Applicant: Sandisk Technologies, Inc., Milpitas, CA (US)

(72) Inventors: Sarath Puthenthermadam, San Jose, CA (US); Yihang Liu, Santa Clara, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 62 days.

(21) Appl. No.: 18/355,337

(22) Filed: Jul. 19, 2023

(65) Prior Publication Data
US 2024/0168661 A1  May 23, 2024

Related U.S. Application Data

(60) Provisional application No. 63/426,455, filed on Nov. 18, 2022.

(51) Int. Cl.
*G06F 3/06* (2006.01)
*G11C 29/12* (2006.01)

(52) U.S. Cl.
CPC .......... *G06F 3/0629* (2013.01); *G06F 3/0619* (2013.01); *G06F 3/0679* (2013.01); *G11C 29/12005* (2013.01); *G11C 2029/1202* (2013.01)

(58) Field of Classification Search
CPC .... G06F 3/0629; G06F 3/0619; G06F 3/0679; G11C 29/12005; G11C 2029/1202
See application file for complete search history.

(56) References Cited

U.S. PATENT DOCUMENTS

| | | | |
|---|---|---|---|
| 9,570,160 B1 | 2/2017 | Shah et al. | |
| 11,456,044 B1 | 9/2022 | Sakakibara | |
| 2016/0371026 A1* | 12/2016 | Shim | G11C 16/3445 |
| 2017/0309344 A1* | 10/2017 | Dutta | G11C 16/0483 |
| 2022/0299378 A1* | 9/2022 | Yang | G11C 29/021 |
| 2023/0148416 A1* | 5/2023 | Guo | G11C 8/12 |
| | | | 365/189.011 |
| 2023/0214127 A1* | 7/2023 | Lee | G06F 11/263 |

* cited by examiner

*Primary Examiner* — Guerrier Merant
*Assistant Examiner* — Jeffrey Andrew Yang
(74) *Attorney, Agent, or Firm* — PEARL COHEN ZEDEK LATZER BARATZ LLP

(57) ABSTRACT

An apparatus is provided that includes a control circuit coupled to a plurality of non-volatile memory cells. The control circuit is configured to perform a program-verify iteration on a first set of the non-volatile memory cells and a second set of the non-volatile memory cells in a plurality of program loops, determine that at least one of the first set of the non-volatile memory cells and the second set of the non-volatile memory cells verification to a programmed state in a first number of program loops, and compare a difference between the first number of program loops and the second number of program loops to an adaptive maximum loop delta limit. The adaptive maximum loop delta limit varies as a function of temperature.

20 Claims, 19 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

VvIM

| $T_{OP}$ (°C) | $\delta_{MAX}(T_{OP})$ |
|---|---|
| $(t_r - 25) < T_{OP} \leq t_r$ | $\delta_{MAX0}$ |
| $(t_r - 35) < T_{OP} \leq (t_r - 25)$ | $(\delta_{MAX0} + \Delta_O)$ |
| $(t_r - 50) < T_{OP} \leq (t_r - 35)$ | $(\delta_{MAX0} + 2\Delta_O)$ |
| $(t_r - 70) < T_{OP} \leq (t_r - 50)$ | $(\delta_{MAX0} + 3\Delta_O)$ |
| $(t_r - 90) < T_{OP} \leq (t_r - 70)$ | $(\delta_{MAX0} + 4\Delta_O)$ |
| ⋮ | ⋮ |

EARLY PROGRAM TERMINATION WITH ADAPTIVE TEMPERATURE COMPENSATION

CLAIM OF PRIORITY

The present application claims priority from U.S. Provisional Patent Application 63/426,455, entitled "EARLY PROGRAM TERMINATION WITH ADAPTIVE TEMPERATURE COMPENSATION," filed Nov. 18, 2022, which is incorporated by reference herein in its entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIGS. 7A-7E depict various threshold voltage distributions and describe a process for programming non-volatile memory.

DETAILED DESCRIPTION

Figure 1:
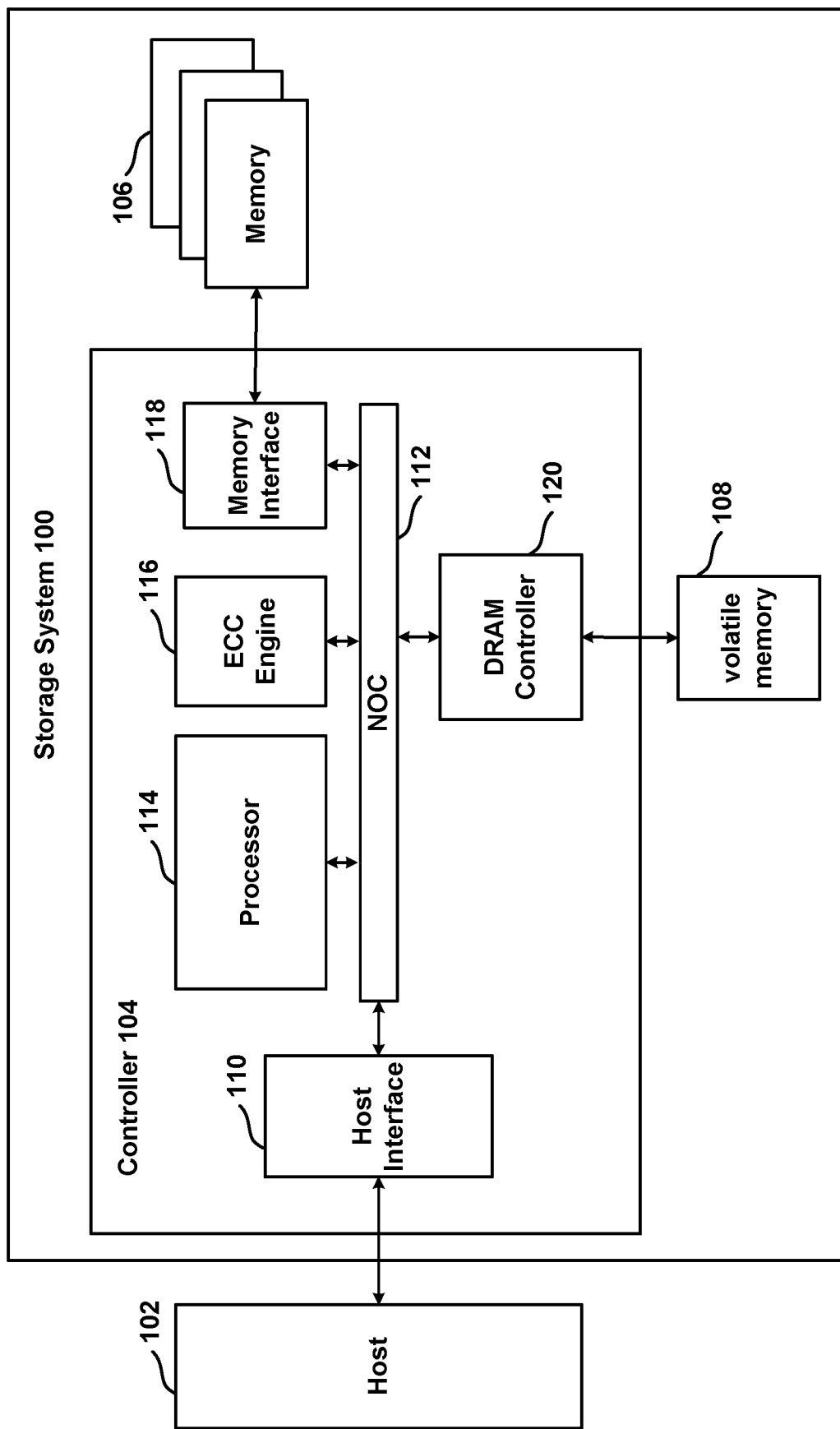
FIG. 1 is a block diagram depicting one embodiment of a memory system.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology. However, scaling the sizes of memory cells entails certain risks.

Indeed, densely packing such smaller memory cells may result in increased manufacturing defects, such as shorting between adjacent word lines, shorting between word lines and interconnects, shorting between word lines and the substrate, and broken word lines. Such manufacturing defects often result in corruption of data stored on the word lines being programmed and nearby word lines.

In some cases, these manufacturing defects are not realized during tests conducted during manufacturing and prior to packaging and shipping the memory devices. Instead, such latent manufacturing defects may only begin to corrupt data after an end user begins programing and erasing the memory cells in such memory devices.

Some memory technologies seek to combat latent manufacturing defects by reading programmed data after programming or evaluating performance after completing programming. However, by the time programming has completed, the programming process may have already damaged data stored in other nearby memory cells.

In addition, some non-volatile memory devices include a multi-plane memory structure organization, and memory cells in the multiple planes connected to the same word lines may be programmed concurrently. Although multi-plane programming may increase programming speed, any defects such as the word line defects described above on one plane may disturb programming of memory cells on the concurrently programmed planes.

Technology is described to implement an early program termination process during multi-plane programming. In an embodiment, the early program termination process determines the number of program loops used to complete programming memory cells on the first plane to a programmed state, and the number of program loops used to program memory cells on the second plane to the programmed state.

In an embodiment, a difference between the two numbers of program loops is compared to an adaptive maximum loop delta limit that varies as a function of temperature. In an embodiment, the adaptive maximum loop delta limit increases with decreasing temperature. In an embodiment, the adaptive maximum loop delta limit increases with increasing temperature.

In an embodiment, if the determined difference is less than or equal to the adaptive maximum loop delta limit, multi-plane programming continues. In an embodiment, if the determined difference is greater than the adaptive maximum loop delta limit, multi-plane programming continues programming on the slower plane terminates and programming continues on the other plane in single-plane programming mode.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
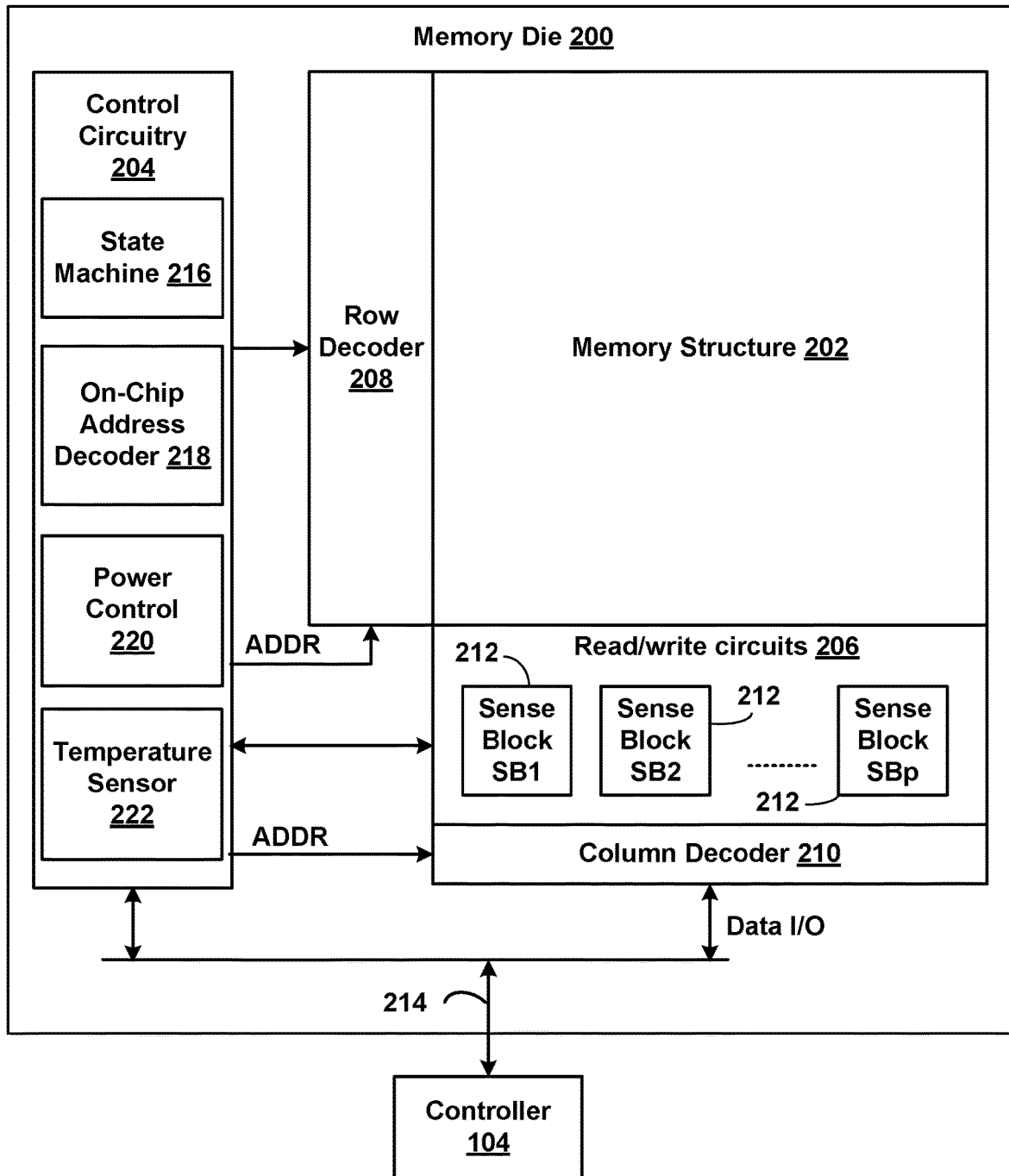
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, a power control circuit 220, and a temperature sensor 222 circuit. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters. In an embodiment, temperature sensor circuit 222 detects a die temperature at memory die 200.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
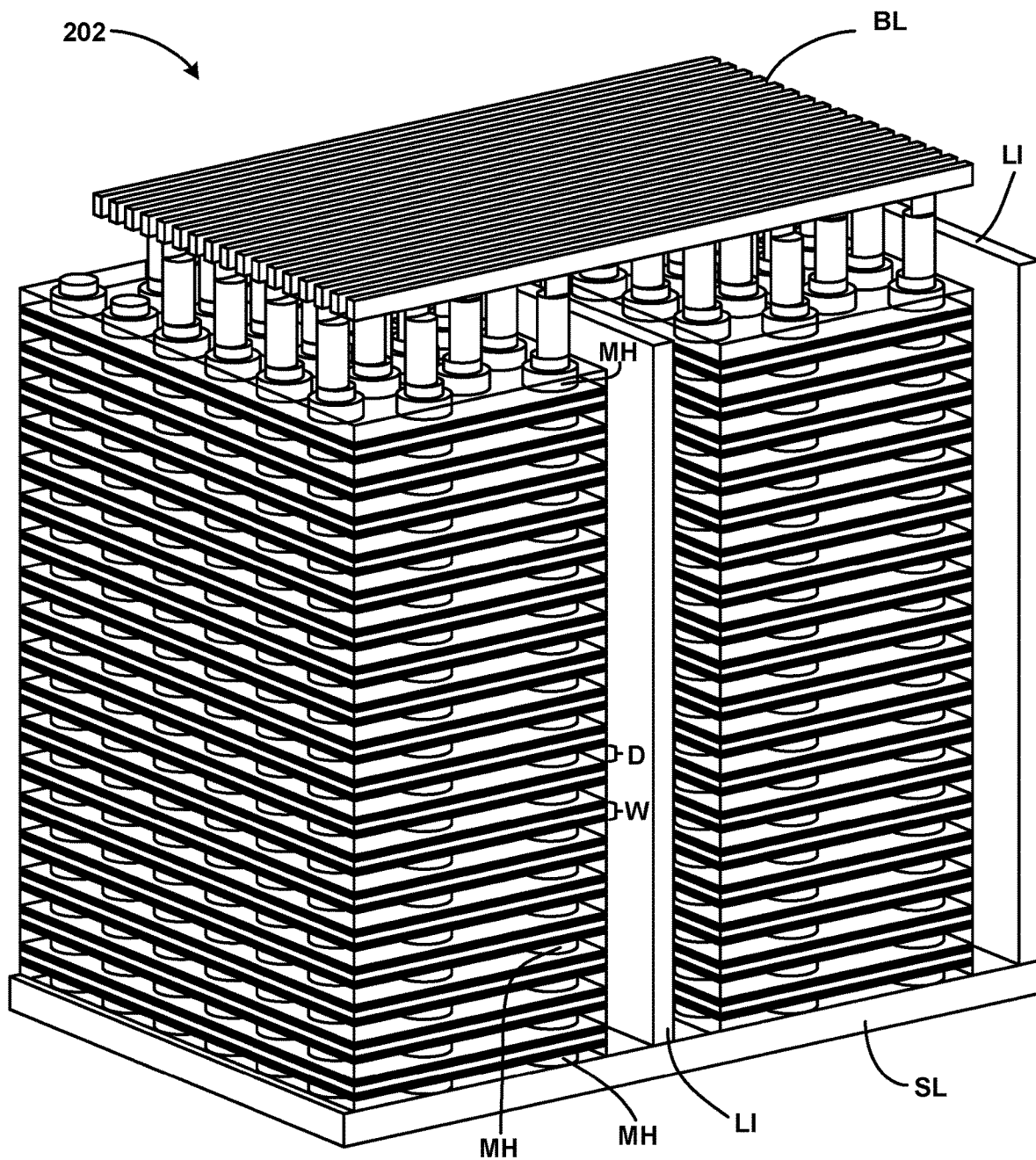
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
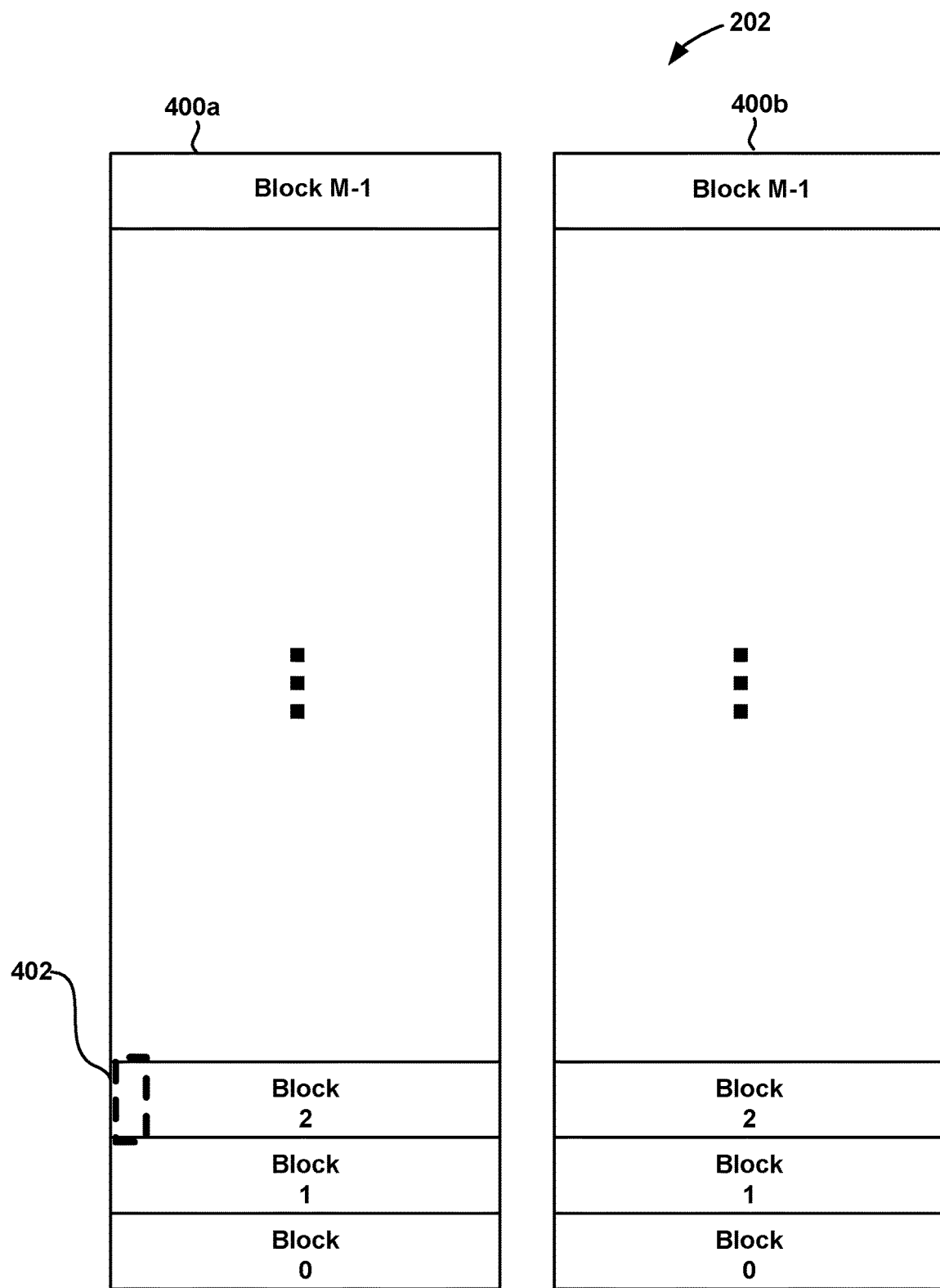
FIG. 4A is a block diagram of a memory structure having two planes.

FIG. 4A is a block diagram explaining one example organization of memory structure 202, which is divided into two planes 400a and 400b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
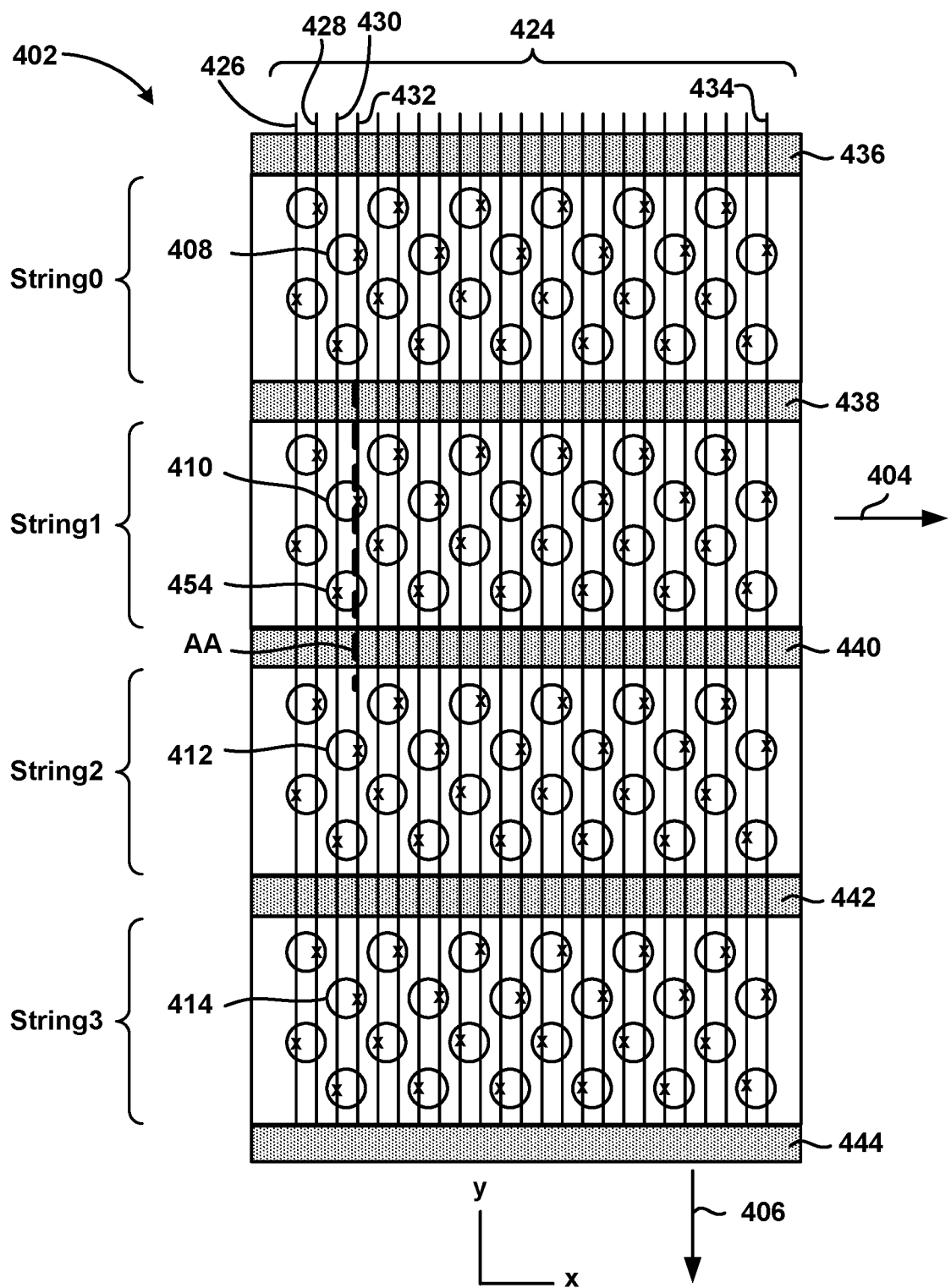
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, Sting2 and String3. In the layers of the block that implement memory cells, String0, String1, Sting2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, Sting2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, Sting2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
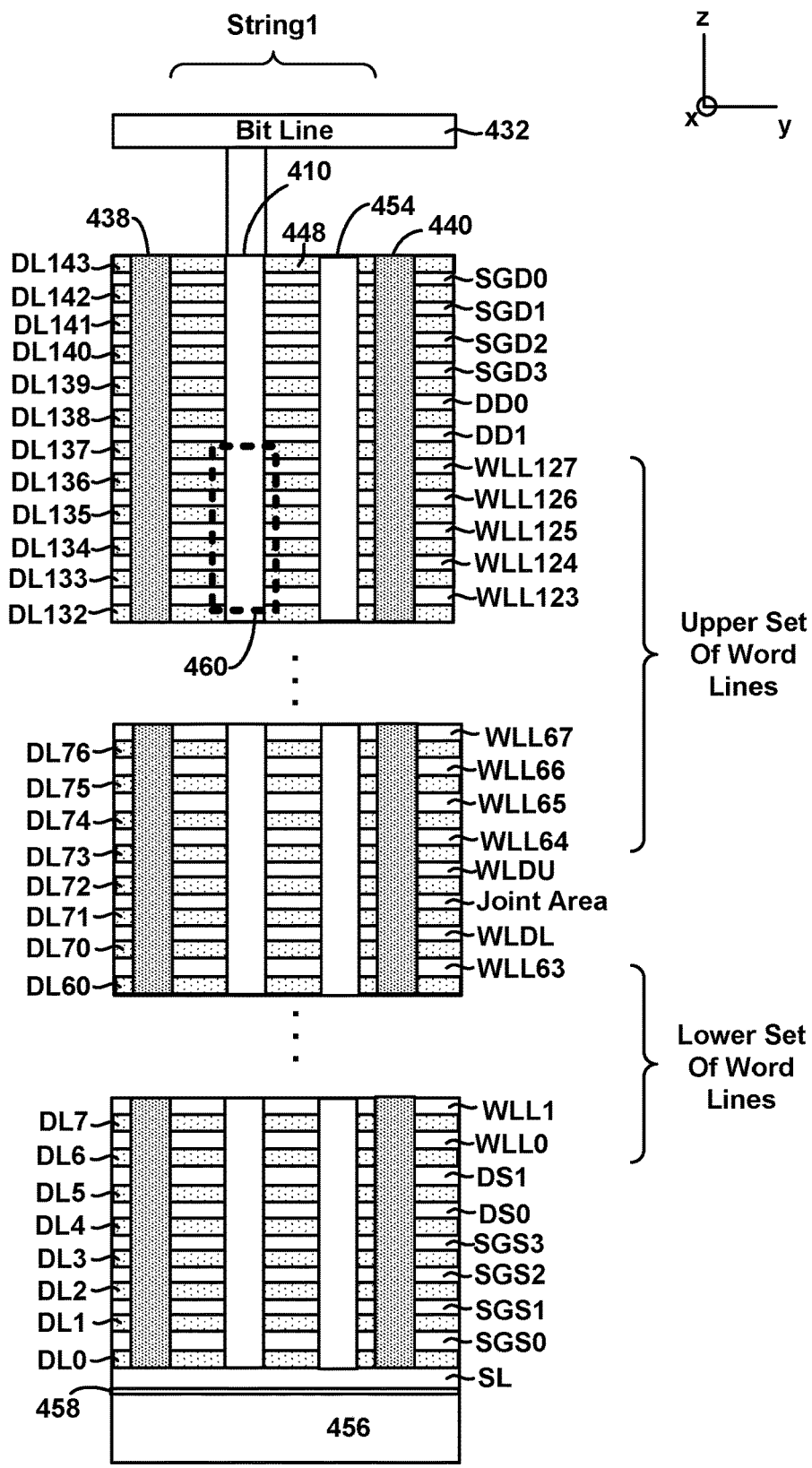
FIG. 4C depicts a cross sectional view of a portion of a block of memory cells.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty eight word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layer DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
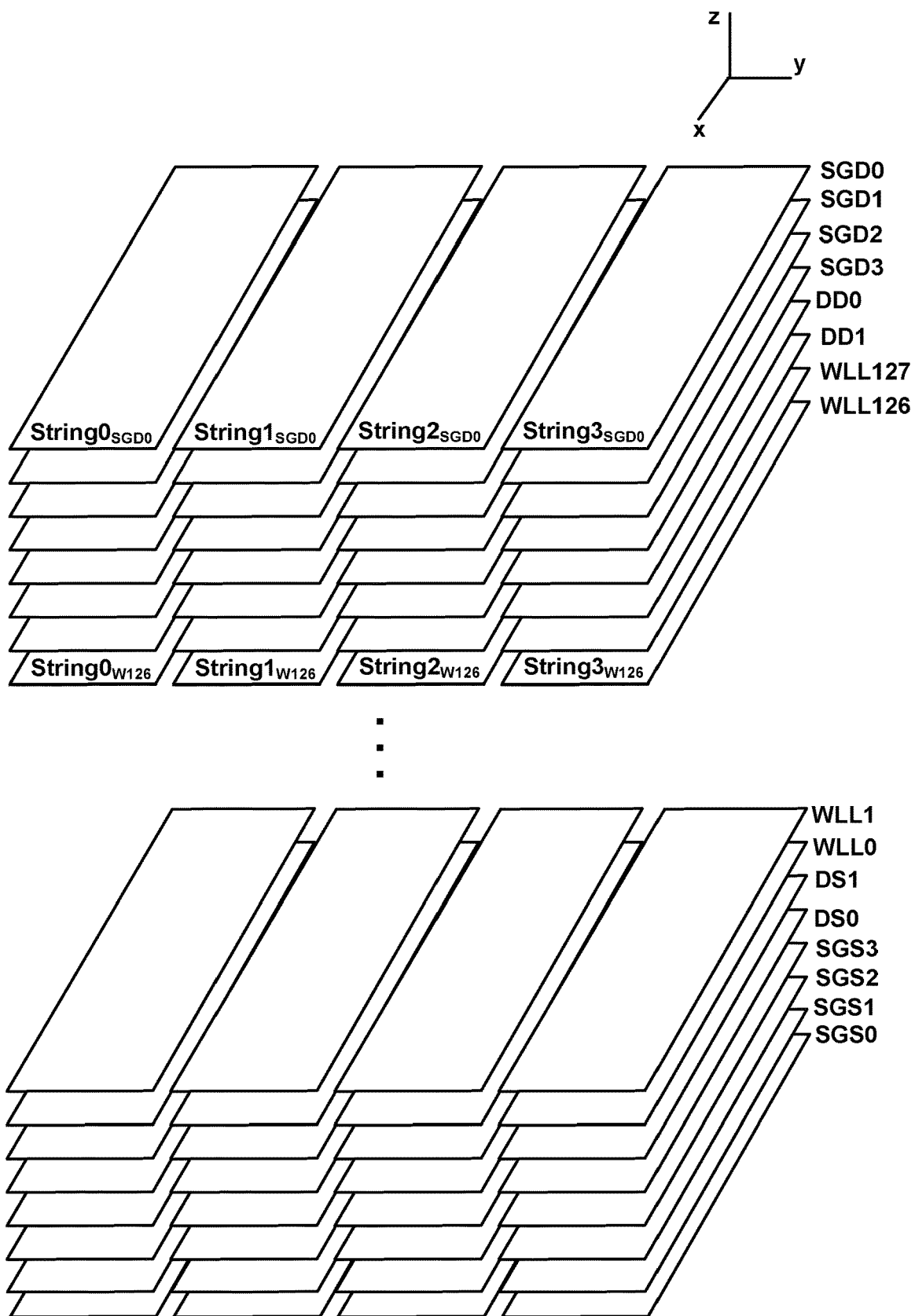
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL126 is divided into regions String0$_{W126}$, String1$_{W126}$, String2$_{W126}$ and String3$_{W126}$. In an embodiment, the four word line fingers on a same level are connected together. In another embodiment, each word line finger operates as a separate word line.

Likewise, drain side select gate layer SGD0 (the top layer) is divided into regions Strin0$_{SGD0}$, String1$_{SGD0}$, String2$_{SGD0}$ and String3$_{SGD0}$, also known as fingers or select line fingers. In an embodiment, the four select line fingers on a same level are connected together. In another embodiment, each select line finger operates as a separate word line.

Figure 4E:
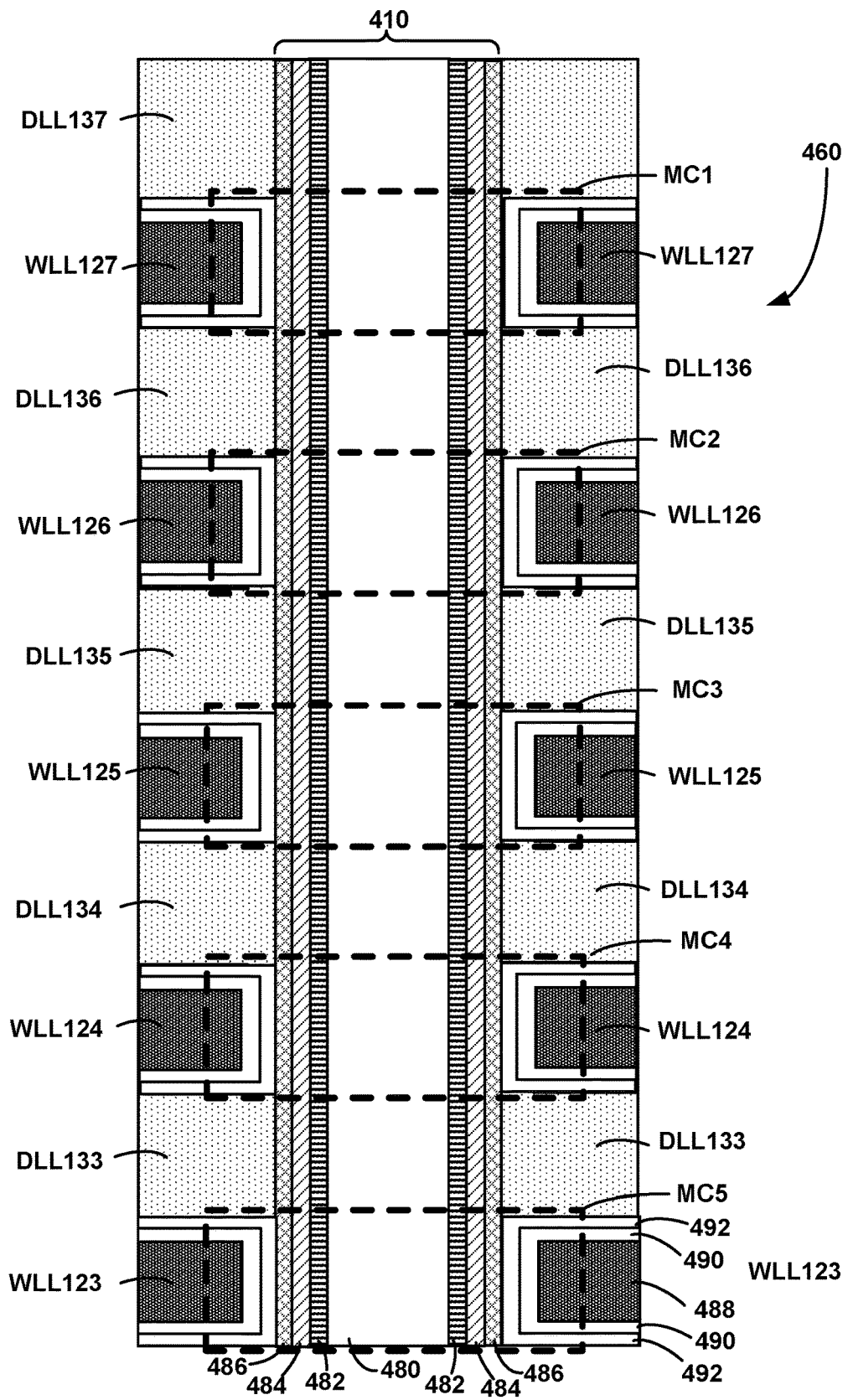
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
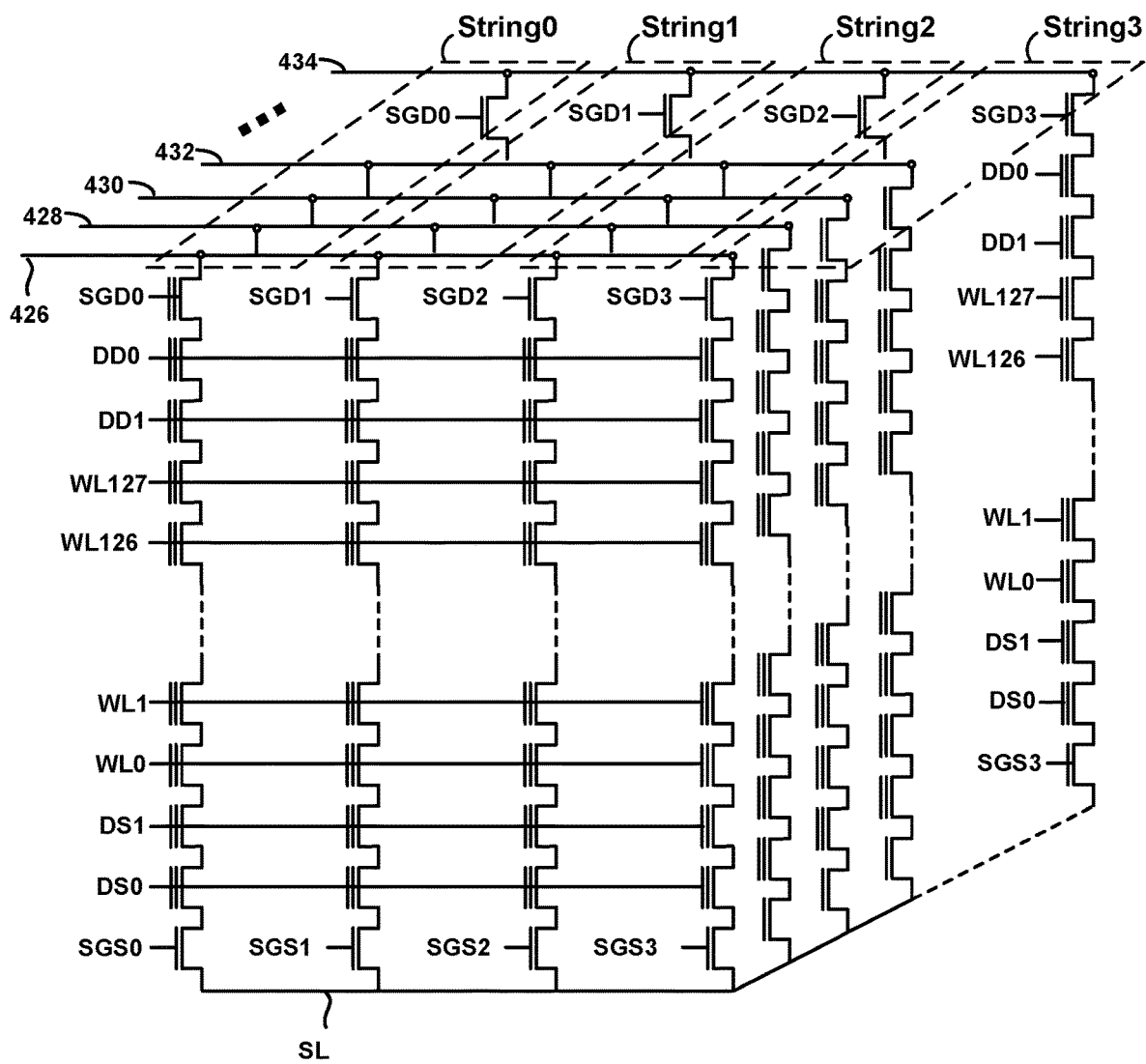
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
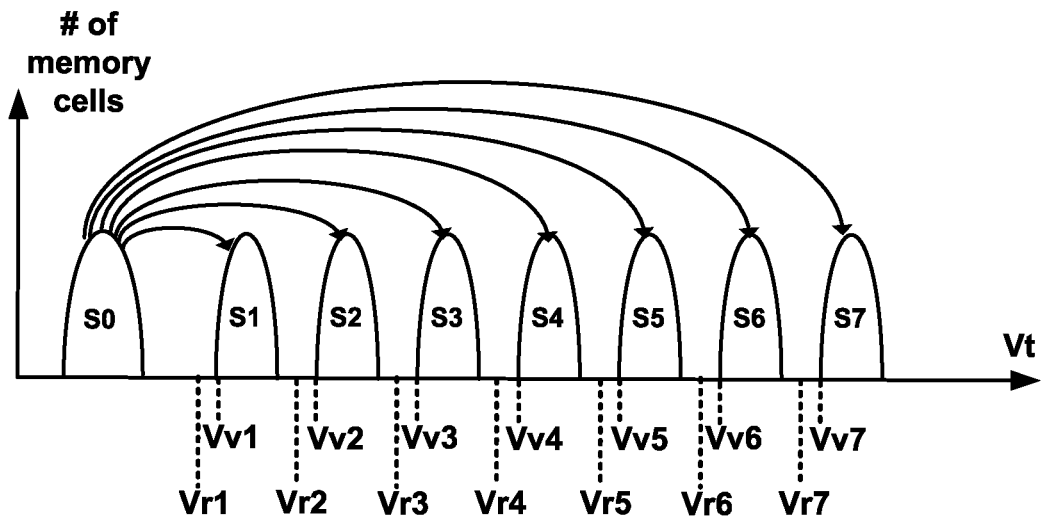
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

Figure 8:
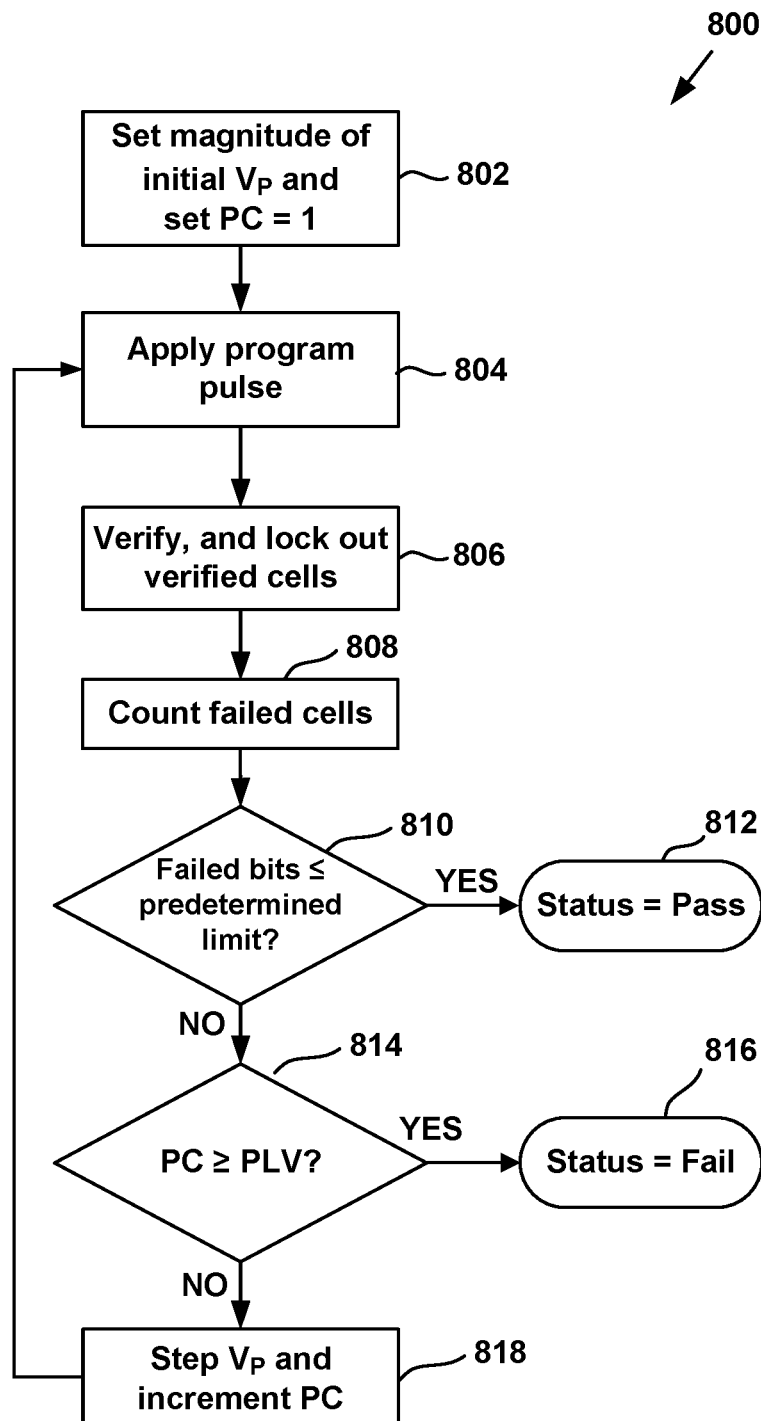
FIG. 8 is a flowchart describing an embodiment of a process for programming non-volatile memory.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above. Additionally, process 800 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 820 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 800 loops back to step 804 and another program pulse is applied to the selected word line so that another iteration (steps 804-818) of programming process 800 is performed. Each pass through steps 804-818 is referred to herein as a "program loop." The program limit value PLV described above therefore specifies a maximum number of program loops that may be used to program the memory cells coupled to the selected word line. The comparison performed at step 814 is referred to herein as a "maximum program count test."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
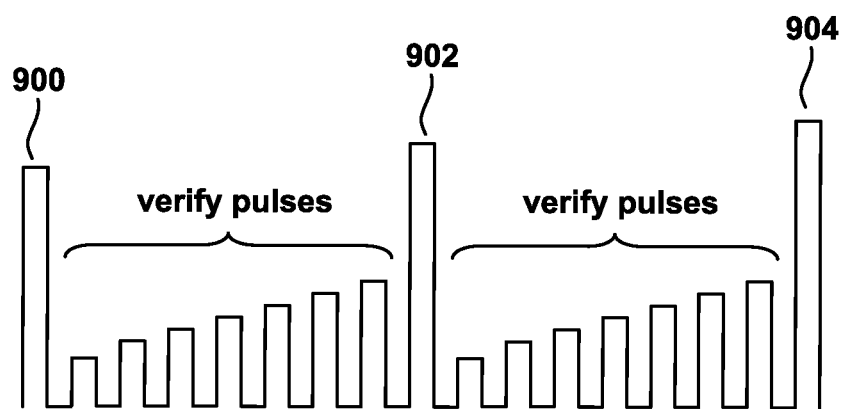
FIG. 9 depicts a word line voltage during programming and verify operations.

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

During a programming operation, a program loop count for a particular programmed state is a count of a number of program loops (e.g., steps 804-818 of process 800 of FIG. 8) used to program the particular programmed state. As used herein, $PL_X$ is the program loop count for state X. For example, referring to FIG. 5, if programmed state X=S1 memory cells complete programming in four program loops, $PL_{S1}=4$. Likewise, if programmed state X=S4 memory cells complete programming in eight program loops, $PL_{S4}=10$, and so on.

As described above, significant advances in memory technology have resulted from steadily reducing the physical dimensions of memory cells, which in turn can be packed more densely on a given die area. Doing so, however, may result in a greater number of manufacturing defects, such as shorting between word lines and other components (such as shorting between adjacent word lines, shorting between word lines and interconnects, shorting between word lines and the substrate) as well as broken word lines.

In many instances, such manufacturing defects do not affect performance of the memory system until the memory system has been used for one or more program-erase cycles, and may only begin to corrupt data after an end user begins programing and erasing memory cells in such memory devices. One technique for addressing such latent manufacturing defects is referred to herein as early program termination (EPT).

In particular, a Controller Device implementing EPT terminates a programming process early when a defect condition exists. Rather than wait until a programming process ends to determine whether a defect condition exists, the Controller Device tests for the defect condition during the programming process. If a defect condition is identified (referred to herein as an "EPT status failure," the Controller Device stops the programming process prior to completing programming. A Controller Device may implement an embodiment of EPT during "multi-plane programming," in which a memory structure is divided into multiple planes, and memory cells in the multiple planes connected to the same word lines may be programmed concurrently.

Figure 10:
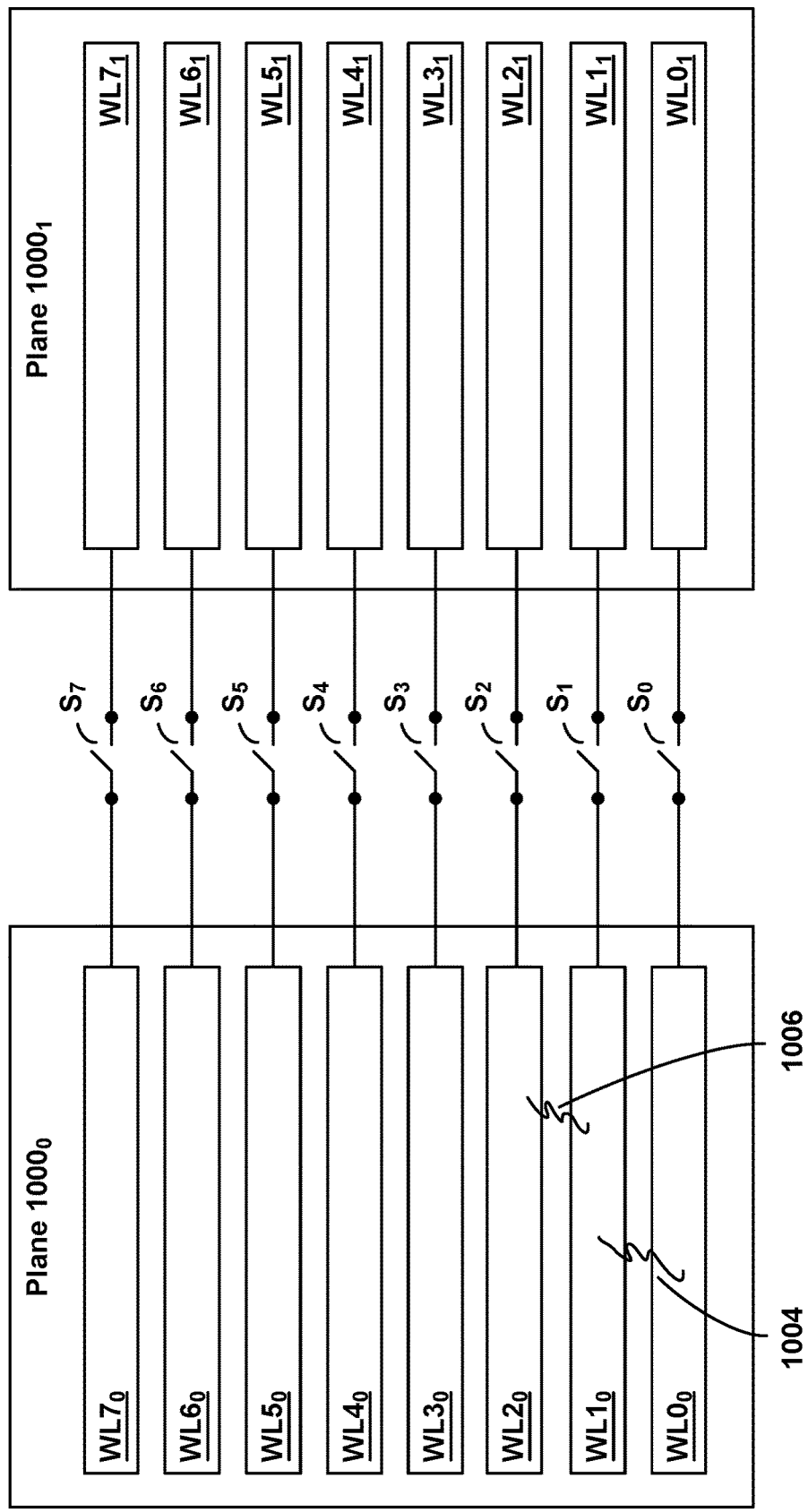
FIG. 10 is a block diagram of a memory structure having two planes.

FIG. 10 is a block diagram depicting a simplified multi-plane organization of memory structure 202 (FIG. 2), which is divided into a first plane $1000_0$ and a second plane $1000_1$ located on the same memory die 200 (FIG. 2). First plane $1000_0$ includes eight word lines $WL0_0$, $WL1_0$, $WL2_0$, ..., $WL7_0$, and second plane $1000_1$ includes eight word lines $WL0_1$, $WL1_1$, $WL2_1$, ..., $WL7_1$. In other embodiments, first plane $1000_0$ and second plane $1000_1$ each may include more or fewer than eight word lines.

Switches $S_0$, $S_1$, ..., $S_7$ may be used to selectively couple word lines $WL0_0$, $WL1_0$, ..., $WL7_0$ on first plane $1000_0$ to corresponding word line $WL0_1$, $WL2_1$, ..., $WL7_1$ on second plane $1000_1$. In multi-plane programming switch $S_0$ closes to couple word lines $WL0_0$ and $WL0_1$, switch $S_1$ closes to couple word lines $WL1_0$ and $WL1_1$, switch $S_2$ closes to selectively couple word lines $WL2_0$ and $WL2_1$, and so on.

In the illustrated example, as a result of a manufacturing defect, a first word line-to-word line short 1004 exists between word line $WL0_0$ and word line $WL1_0$, and a second word line-to-word line short 1006 exists between word line $WL1_0$ and word line $WL2_0$. In this example, the manufacturing defects are only on word lines in first plane $1000_0$. No word line-to-word line shorts exist on second plane $1000_1$. In other instances, manufacturing defects may exist only in second plane $1000_1$, or in both first plane $1000_0$ and second plane $1000_1$.

During programming, one or more programming pulses are applied to word lines $WL0_0$ and $WL0_1$, one or more programming pulses are applied to word lines $WL1_0$ and $WL1_1$, one or more programming pulses are applied to word lines $WL2_0$ and $WL2_1$, and so on. As a result of first word line-to word line short 1004 and second word line-to word line short 1006, programming of memory cells coupled to word line $WL0_0$ fails because the voltage of word line $WL0_0$ is pulled down by shorted word lines $WL1_0$ and $WL2_0$.

In particular, word line $WL0_0$ is unable to reach a high enough voltage level to successfully program memory cells coupled to word line $WL0_0$ before the maximum number of program loops is reached (e.g., step 816=YES in FIG. 8). First word line-to word line short 1004 and second word line-to word line short 1006 cause the same failure to occur while attempting to program memory cells coupled to word lines $WL1_0$ and $WL2_0$.

Although no word line-to-word line shorts exist in second plane $1000_1$, switches $S_0$, $S_1$, ..., $S_7$, couple corresponding word lines on first plane $1000_0$ and second plane $1000_1$. Accordingly, because the voltage of $WL0_0$ is pulled down by shorted word lines $WL1_0$ and $WL2_0$, coupled word line $WL0_1$ also is unable to reach a high enough voltage level to successfully program memory cells coupled to word line $WL0_1$ before the maximum number of program loops is reached (e.g., step 816=YES in FIG. 8). Likewise, the same failure occurs while attempting to program memory cells coupled to word lines $WL1_1$ and $WL2_1$.

This phenomenon is sometimes referred to as "neighbor plane disturb," or "NPD." In such a scenario, first plane $1000_0$ is sometimes referred to as the "attacker block," and second plane $1000_1$ is sometimes referred to as the "victim block" because word line defects on first plane $1000_0$ disturb programming of coupled word lines of second plane $1000_1$. EPT techniques, such as those described above, may be used to mitigate the impact of NPD. Accordingly, EPT techniques are sometimes referred to as "NPD countermeasures."

Figure 11A:
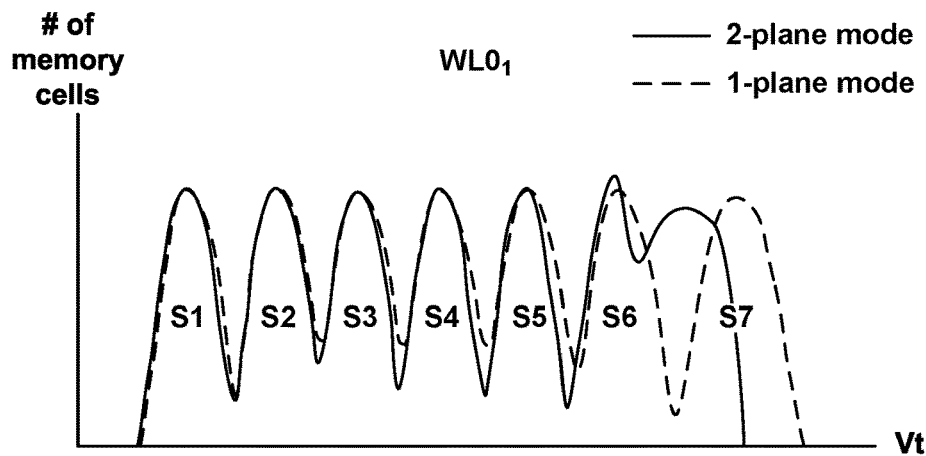
FIGS. 11A-11C depict various threshold voltage distributions.
Figure 11B:
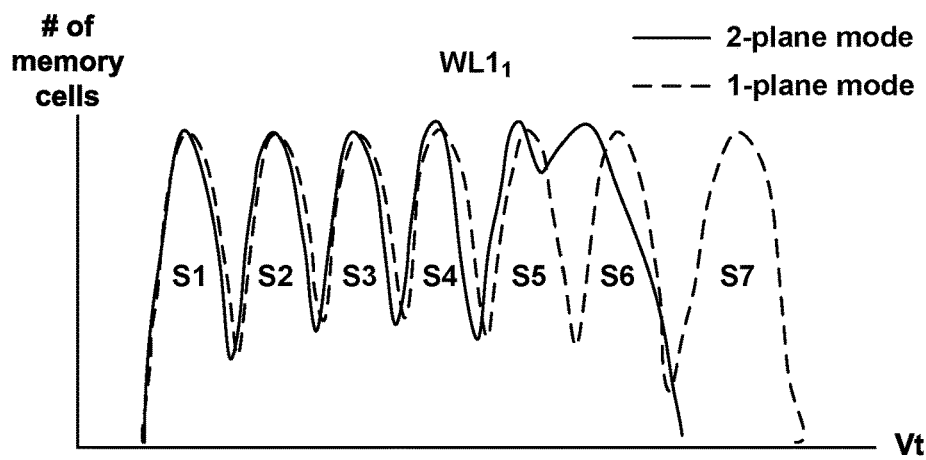
Figure 11C:
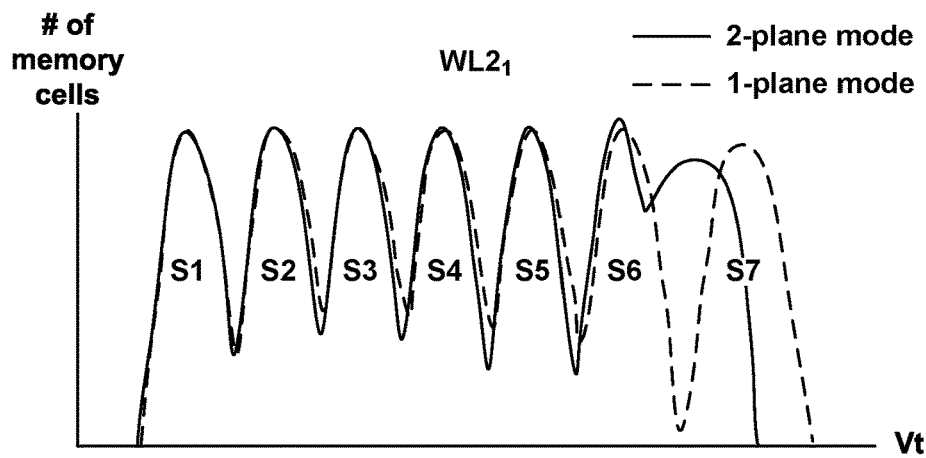

FIGS. 11A-11C depict example threshold voltage distributions of programmed states S1-S7 on word lines $WL0_1$, $WL1_1$ and $WL2_1$ of second plane $1000_1$. In particular, the solid curve in each figure depicts example threshold voltage distributions when programming first plane $1000_0$ and second plane $1000_1$ in two-plane mode, with shorted word lines $WL1_0$ and $WL2_0$ on first plane $1000_0$. The dashed curve in each figure depicts example threshold voltage distributions when programming second plane $1000_1$ in single-plane mode (that is, without the impact of shorted word lines $WL1_0$ and $WL2_0$ on first plane $1000o$).

In the illustrated examples of FIGS. 11A-11C, although pulled down by shorted word lines $WL1_0$ and $WL2_0$ on first plane $1000_0$, the voltage of each of word lines $WL0_1$, $WL1_1$, and $WL2_1$ in two-plane mode is high enough to program lower programmed states S1-S4 before the maximum number of program loops is reached. In contrast, the pulled down voltage of each of word lines $WL0_1$, $WL1_1$, and $WL2_1$ in two-plane mode is too low to correctly program higher programmed states S5-S7 before the maximum number of program loops is reached. As a result, in two-plane mode programming of memory cells coupled to word lines $WL0_1$, $WL1_1$ and $WL2_1$ fails.

As described above, a Controller Device may implement an embodiment of EPT in multi-plane programming mode (referred to herein as "EPT enabled"), such as the two-plane programming process described above and illustrated in FIGS. 10 and 11A-11C. In an embodiment, the Controller Device determines a difference in program loop counts (referred to herein as a "loop delta") between two planes for one or more programmed states:

$$\Delta_{X\alpha\beta} = (PL_{X\alpha} - PL_{X\beta})$$

where $\Delta_{X\alpha\beta}$ is the loop delta between planes α and β for state X, $PL_{X\alpha}$ is the program loop count for state X on plane α, and $PL_{X\beta}$ is the program loop count for state X on plane β.

In an embodiment, if the determined loop delta $\Delta_{X\alpha\beta}$ is less than or equal to a maximum loop delta limit $\delta_{MAX}$ ($\Delta_{X\alpha\beta} \leq \delta_{MAX}$) (e.g., $\delta_{MAX}$=4 loops), the Controller Device determines that an EPT status failure has not occurred and continues programming the remaining programmed states (e.g., programmed states S2-S7) in multi-plane programming mode.

In an embodiment, if the determined loop delta $\Delta_{X\alpha\beta}$ exceeds the maximum loop delta limit $\delta_{MAX}$ ($\Delta_{X\alpha\beta} \geq \delta_{MAX}$) (e.g., $\delta_{MAX}$=4 loops), the Controller Device determines that an EPT status failure has occurred and that a defect exists on the slower plane. The Controller then terminates programming of the slower plane, and continues programming the remaining programmed states (e.g., programmed states S2-S7) on the faster plane in single plane programming mode.

Figure 12A:
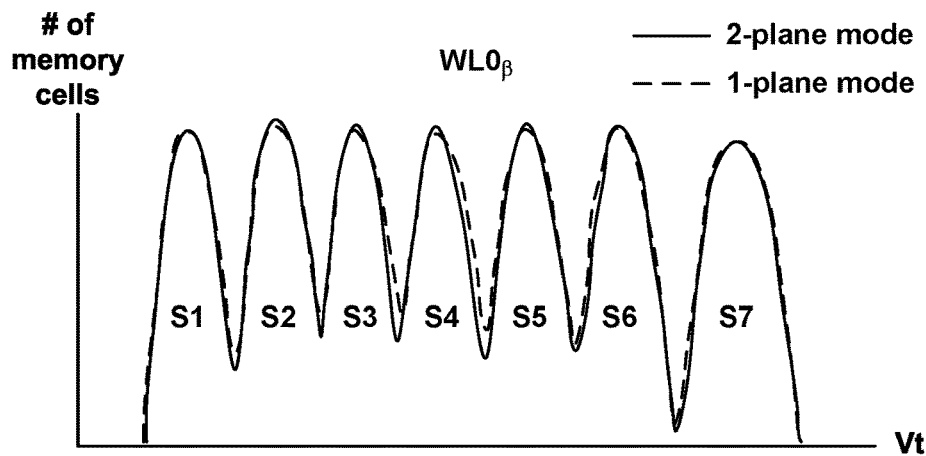
FIGS. 12A-12C depict various threshold voltage distributions.
Figure 12B:
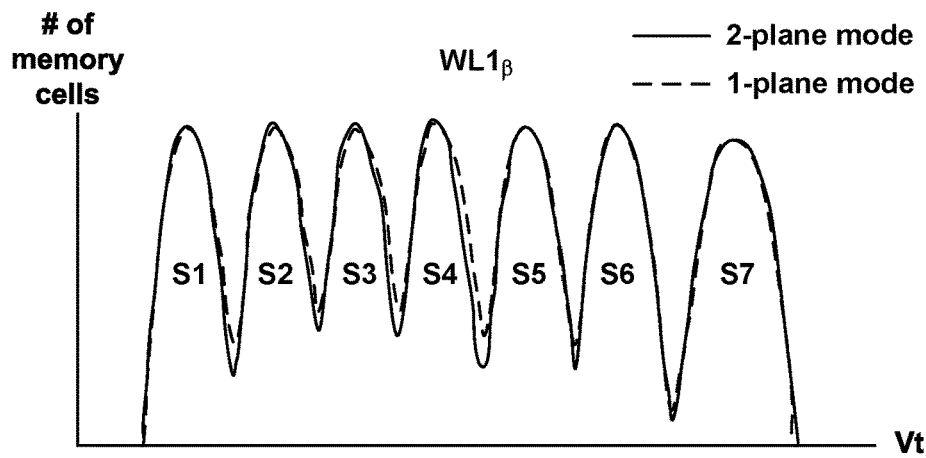
Figure 12C:
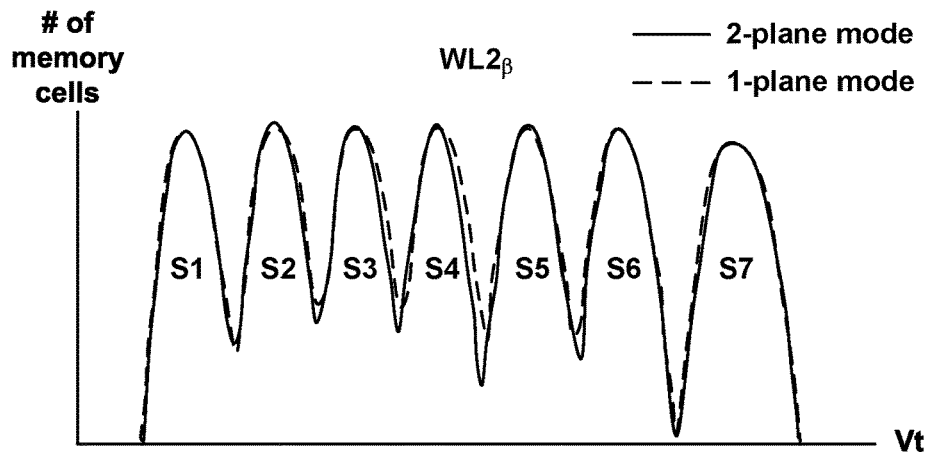

FIGS. 12A-12C depict example threshold voltage distributions of programmed states S1-S7 on word lines $WL0_1$, $WL1_1$ and $WL2_1$ of second plane $1000_1$ with EPT enabled. In particular, after determining that the loop delta $\Delta_{X01}$ between first plane $1000_0$ and second plane $1000_1$ for state X exceeds the maximum loop delta limit $\delta_{MAX}$ ($\Delta_{X01} > \delta_{MAX}$), the Controller Device determines that an EPT status failure has occurred, terminates programming of first plane $1000_0$, and continues programming the remaining programmed states S2-S7 on second plane $1000_1$ in single plane programming mode.

The solid curve in each figure depicts example threshold voltage distributions when programming first plane $1000_0$ and second plane $1000_1$ began in two-plane mode, but switched to single-plane mode when the Controller Device detected the EPT status failure. The dashed curve in each figure depicts example threshold voltage distributions when programming second plane $1000_1$ solely in single-plane mode. As can be seen in FIGS. 12A-12C, the threshold voltage distributions are almost indistinguishable in the two different scenarios, and EPT resulted in successful programming of memory cells coupled to word lines $WL0_1$, $WL1_1$ and $WL2_1$ of second plane $1000_1$.

In an embodiment, the maximum loop delta limit $\delta_{MAX}$ is the same for all programmed states (e.g., programmed states S1-S7). In other embodiments, the maximum loop delta limit $\delta_{MAX}$ has a first value $\delta_{MAXH}$ for programmed state S1, and has a second value $\delta_{MAXL}$ for all other programmed states (e.g., programmed states S2-S7). In an embodiment, the maximum loop delta limit $\delta_{MAX}$ is the same for all operating temperatures.

In some instances, the loop delta $\Delta_{X\alpha\beta}$ between planes $\alpha$ and $\beta$ for one or more states varies with temperature. For example, in some instances a block of memory cells on a first plane $\alpha$ may program slower than the corresponding block of memory cells on a second plane $\beta$ with decreasing temperature, even though there are no defects on first plane $\alpha$. In other instances a block of memory cells on a first plane $\alpha$ may program slower than the corresponding block of memory cells on a second plane $\beta$ with increasing temperature, even though there are no defects on first plane $\alpha$. Without wanting to be bound by any particular theory, it is believed that a fabrication process issue may cause such temperature-dependent phenomena.

Figure 13A:
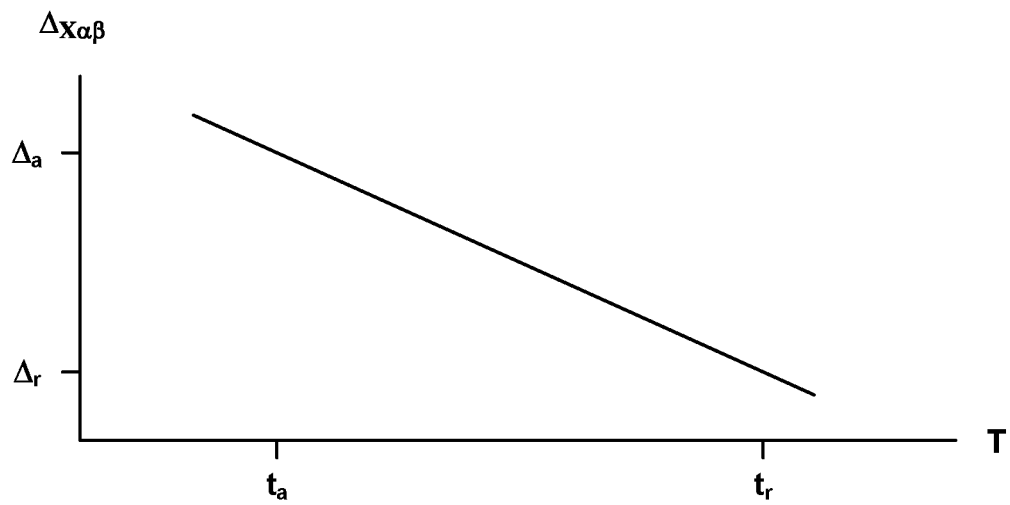
FIGS. 13A-13B depict diagrams of example loop deltas between planes versus temperature.
Figure 13B:
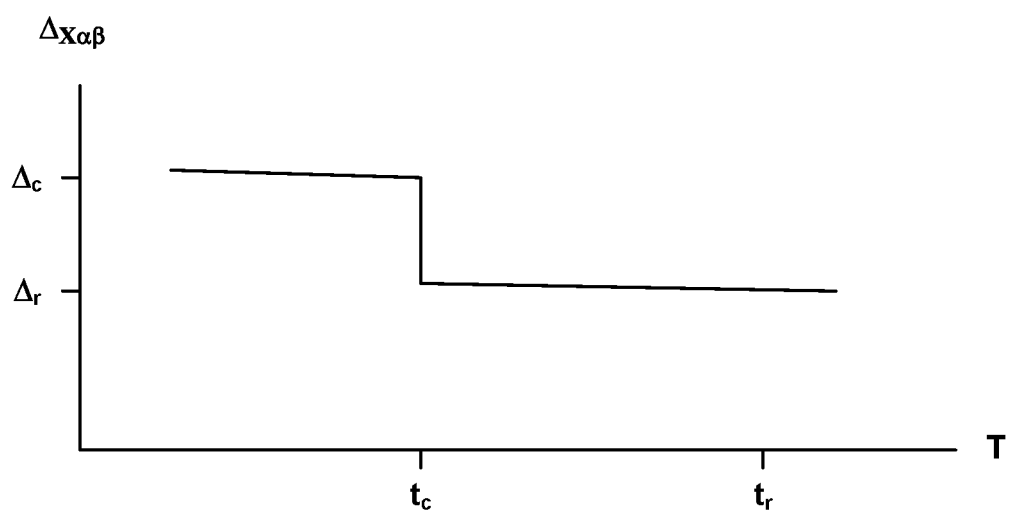

FIGS. 13A-13B depicts example scenarios of such phenomena. In particular, FIG. 13A depicts a diagram of a first example loop delta $\Delta_{X\beta\beta}$ between planes $\alpha$ and $\beta$ versus temperature. In this example, the loop delta $\Delta_{X\alpha\beta}$ between planes $\alpha$ and $\beta$ monotonically increases with decreasing temperature. For example, at a first (reference) temperature $t_r$ (e.g., $t_r=85°$ C.) the loop delta $\Delta_{X\alpha\beta}$ between planes $\alpha$ and $\beta$ has a first (reference) loop delta value $\Delta_r$, and at a second (lower) temperature $t_a$ the loop delta $\Delta_{X\alpha\beta}$ between planes $\alpha$ and $\beta$ has a second loop delta value $\Delta_a$, with the $\Delta_a<\Delta_r$.

FIG. 13B depicts a diagram of a second example loop delta $\Delta_{X\alpha\beta}$ between planes $\alpha$ and $\beta$ versus temperature. In this example, the loop delta $\Delta_{X\alpha\beta}$ between planes a and $\beta$ increases significantly below a particular temperature. For example, at a first (reference) temperature $t_r$ (e.g., $t_r=85°$ C.) the loop delta $\Delta_{X\alpha\beta}$ between planes $\alpha$ and $\beta$ has a first (reference) loop delta value $\Delta_r$, and at a second (cutoff) temperature $t_c$ the loop delta $\Delta_{X\alpha\beta}$ between planes $\alpha$ and $\beta$ has a second loop delta value $\Delta_c$, with the $\Delta_c<\Delta_r$.

Persons of ordinary skill in the art will understand the loop delta $\Delta_{X\alpha\beta}$ between planes $\alpha$ and $\beta$ for one or more states may vary with temperature in ways other than depicted in FIGS. 13A-13B. For example, whereas FIG. 13A depicts loop delta $\Delta_{X\alpha\beta}$ varying as a linear function of temperature, and FIG. 13B depicts loop delta $\Delta_{X\alpha\beta}$ varying as a piecewise linear function of temperature, in other instances loop delta $\Delta_{X\alpha\beta}$ may vary as a non-linear function of temperature. In addition, whereas FIGS. 13A-13B depict loop delta $\Delta_{X\alpha\beta}$ increasing with decreasing temperature, in other instances loop delta $\Delta_{X\alpha\beta}$ may increase with increasing temperature.

For simplicity, the following discussion will describe scenarios in which loop delta $\Delta_{X\alpha\beta}$ increases with decreasing temperature. Persons of ordinary skill in the art will understand that the same principles may be applied in instances in which loop delta $\Delta_{X\alpha\beta}$ increases with increasing temperature.

If the maximum loop delta limit $\delta_{MAX}$ is the same for all operating temperatures, at lower temperatures loop delta $\Delta_{X\alpha\beta}$ may exceed the maximum loop delta limit $\delta_{MAX}$ even though there are no defects or other reliability issue on the slower plane. As a result, using a maximum loop delta limit $\delta_{MAX}$ that is constant for all operating temperatures with EPT enabled may result in unnecessarily terminating programming on defect-free and otherwise reliable blocks of memory cells. Thus, it would be desirable to prevent EPT status failures due to the temperature-dependent slower blocks of memory cells in such instances while EPT is enabled.

Figure 14:
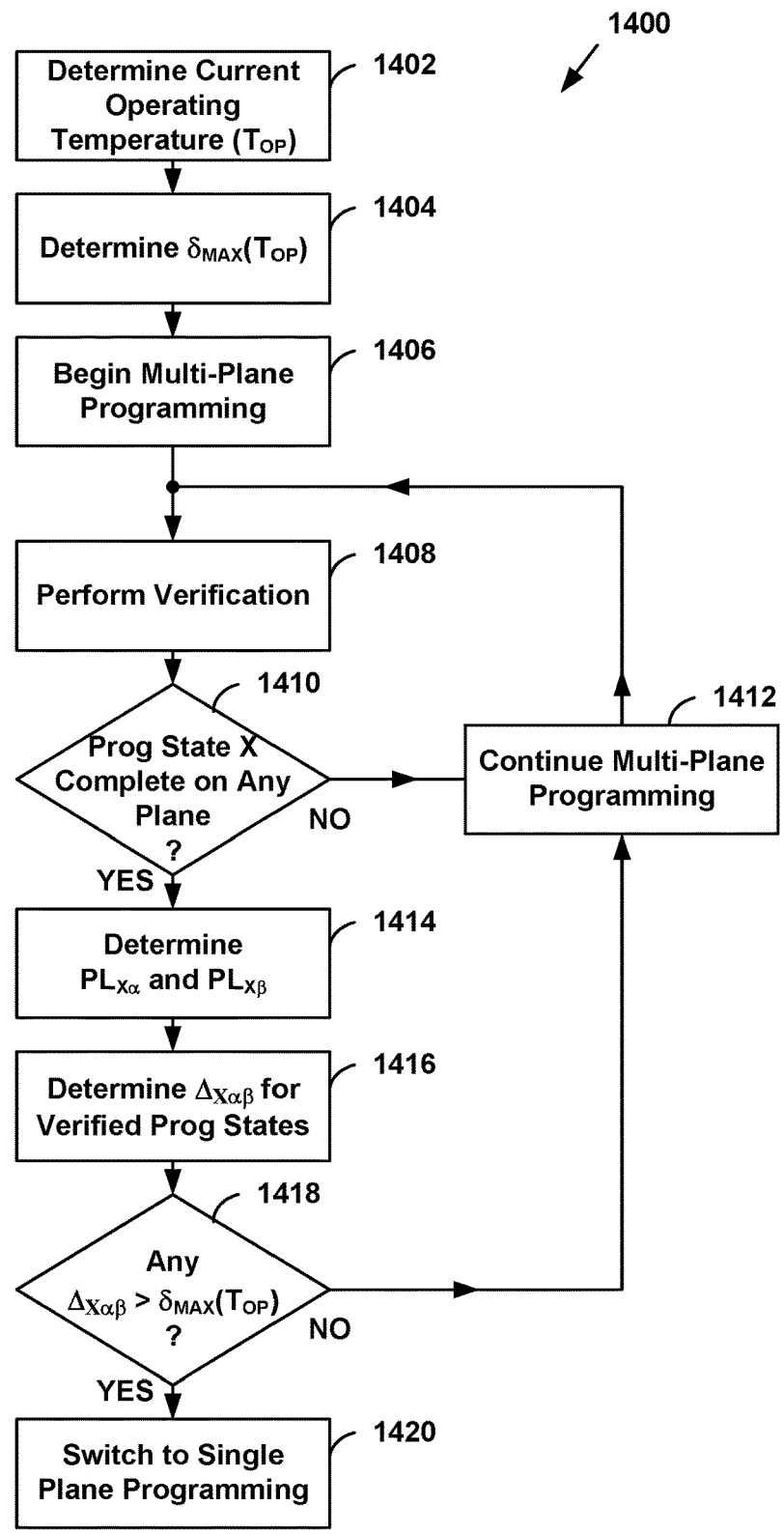
FIG. 14 is a flow chart describing one embodiment of an early program termination process.

FIG. 14 is a flow chart describing one embodiment of an EPT process 1400 for multi-plane programming using an adaptive maximum loop delta limit $\delta_{MAX}$ that varies based on chip temperature (e.g., a temperature of the memory die). In embodiments, a Controller Device implements process 1400. To simplify the following discussion, example process 1400 is described in the context of a multi-plane programming process that concurrently programs two planes: a first plane $\alpha$ and a second plane $\beta$. Persons of ordinary skill in the art will understand that process 1400 may be extended to multi-plane programming processes that concurrently program more than two planes.

At step 1402, a chip temperature $T_{OP}$ is acquired. In an embodiment, chip temperature $T_{OP}$ is a temperature at one or more locations on a memory die containing the memory cells being programmed. In an embodiment, chip temperature $T_{OP}$ is an average or median temperature at one or more locations on a memory die containing the memory cells being programmed. In an embodiment, chip temperature $T_{OP}$ may be determined from a temperature sensor circuit, such as temperature sensor circuit 222 of FIG. 2. Alternatively, other techniques may be used to determine chip temperature $T_{OP}$.

Figures 15A, 15B:
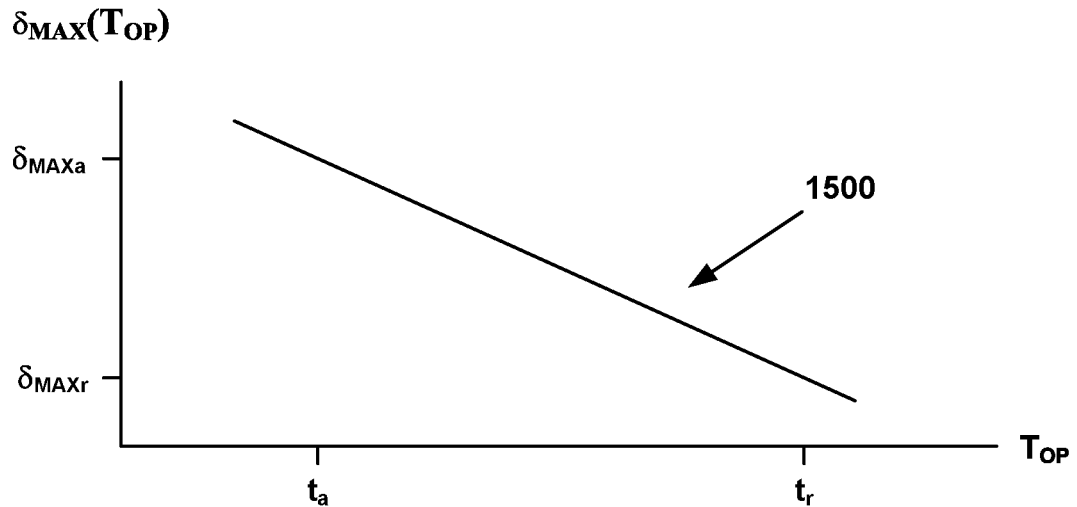
FIG. 15A depicts a diagram of a straight-line representation maximum loop delta limit versus chip temperature.
FIG. 15B depicts a table of chip temperature values and corresponding maximum loop delta limit values.

At step 1404, an maximum loop delta limit $\delta_{MAX}(T_{OP})$ is determined based on chip temperature $T_{OP}$. For example, FIG. 15A depicts a diagram of a straight-line representation 1500 of maximum loop delta limit $\delta_{MAX}(T_{OP})$ versus chip temperature $T_{OP}$. In particular, at a first chip temperature $T_{OP}$ (e.g., reference temperature $t_r=85°$ C.), maximum loop delta limit $\delta_{MAX}(T_{OP})$ has a first value $\delta_{MAXr}$ (e.g., 4) and at a second temperature (e.g., $t_a=-25°$ C.) maximum loop delta limit $\delta_{MAX}(T_{OP})$ has a second value $\delta_{MAXa}$ (e.g., 6).

In an embodiment, using straight line representation 1500, the Controller Device may determine maximum loop delta limit $\delta_{MAX}(T_{OP})$ values for chip temperatures in the range ($t_a \leq T_{OP} \leq t_r$). In this regard, maximum loop delta limit $\delta_{MAX}(T_{OP})$ adaptively increases linearly with decreasing chip temperature $T_{OP}$. In an embodiment, the Controller Device may store a linear equation based on empirical data that characterizes the straight line representation 1500, and may solve the equation to determine maximum loop delta limit $\delta_{MAX}(T_{OP})$. In an embodiment, for non-integer values of maximum loop delta limit $\delta_{MAX}(T_{OP})$ the Controller Device rounds to the next closest integer value.

For example, if Controller Device determines a maximum loop delta limit $\delta_{MAX}(T_{OP})$ value of 4.3, Controller Device rounds down to a maximum loop delta limit $\delta_{MAX}(T_{OP})=4$, whereas if Controller Device determines a maximum loop delta limit $\delta_{MAX}(T_{OP})$ value of 4.7, Controller Device rounds up to a maximum loop delta limit $\delta_{MAX}(T_{OP})=5$.

In another embodiment, maximum loop delta limit $\delta_{MAX}(T_{OP})$ adaptively increases in a step-wise manner with decreasing chip temperature $T_{OP}$. For example, FIG. 15B depicts a table of chip temperature $T_{OP}$ values and corresponding maximum loop delta limit $\delta_{MAX}(T_{OP})$ values.

In particular, for chip temperatures in a first range of values [$(t_r-25)<T_{OP}\leq t_r$], the corresponding maximum loop delta limit $\delta_{MAX}(T_{OP})$ equals an initial maximum loop delta limit value $\delta_{MAX0}$ (e.g., $\delta_{MAX0}=4$, $\delta_{MAX}(T_{OP})=4$). Initial maximum loop delta limit value $\delta_{MAX0}$ may be determined based on empirical data obtained from a sampling of actual memory die, or based on other techniques.

For chip temperatures in a second range of values [$(t_r-35)<T_{OP}\leq(t_r-25)$], the corresponding maximum loop delta limit $\delta_{MAX}(T_{OP})$ equals initial maximum loop delta limit value ($\delta_{MAX0}+\Delta_O$), where $\Delta_O$ is an offset value (e.g., $\Delta_O=1$, $\delta_{MAX}(T_{OP})=5$).

For chip temperatures in a third range of values [$(t_r-50)<T_{OP}\leq(t_r-35)$], the corresponding maximum loop delta limit $\delta_{MAX}(T_{OP})$ equals initial maximum loop delta limit value ($\delta_{MAX0}+2\Delta_O$) (e.g., $\delta_{MAX}(T_{OP})=6$).

For chip temperatures in a fourth range of values [$(t_r-70)<T_{OP}\leq(t_r-50)$], the corresponding maximum loop delta limit $\delta_{MAX}(T_{OP})$ equals initial maximum loop delta limit value ($\delta_{MAX0}+3\Delta_O$) (e.g., $\delta_{MAX}(T_{OP})=7$).

For chip temperatures in a fourth range of values [$(t_r-90)<T_{OP}\leq(t_r-70)$], the corresponding maximum loop delta limit $\delta_{MAX}(T_{OP})$ equals initial maximum loop delta limit value ($\delta_{MAX0}+3\Delta_O$) (e.g., $\delta_{MAX}(T_{OP})=8$).

In this regard, as the chip temperature $T_{OP}$ decreases, the corresponding maximum loop delta limit $\delta_{MAX}(T_{OP})$ increases, relaxing the criteria for determining if a defect has been detected that triggers an EPT status failure. Thus, more stringent criteria may be used for higher chip temperatures $T_{OP}$, and the criteria may be relaxed as chip temperatures $T_{OP}$ decrease.

Without wanting to be bound by any particular theory, it is believed that using an adaptive maximum loop delta limit $\delta_{MAX}(T_{OP})$ that varies based on chip temperature $T_{OP}$ may reduce the number of EPT status failures for blocks of memory cells that do not have defects or other reliability issues.

Persons of ordinary skill in the art will understand that the chip temperature $T_{OP}$ breakpoint values may be other than those depicted in FIG. 15B, and that more or fewer stepwise breakpoint values may be used. In addition, persons of ordinary skill in the art will understand that offset value $\Delta_O$ may be a fixed value, or may be a variable value.

Further, persons of ordinary skill in the art will understand that adaptive maximum loop delta limit $\delta_{MAX}(T_{OP})$ values may be determined in other ways based on chip temperature $T_{OP}$. For example, adaptive maximum loop delta limit $\delta_{MAX}(T_{OP})$ may be determined from a non-linear equation based on chip temperature $T_{OP}$, or by some other technique.

Referring again to FIG. 14, at step 1406 multi-plane programming begins. In an embodiment, the example programming process 800 described above and depicted in FIG. 8 is used. In an embodiment, programming process 800 is used to concurrently program first plane α and second plane β.

At step 1408, a verification process is performed on memory cells of each plane. For example, the verification process at step 806 of process 800 may be performed. Other verification processes may be used.

At step 1410, a determination is made whether programming is complete for programmed state X on any plane (e.g., that all memory cells being programmed to programmed state X have passed verification at step 1408) for all programmed states.

If at step 1410 a determination is made that programming has not completed on any plane for any programmed state X checked at step 1410, at step 1412 multi-plane programming continues and process 1400 loops back to step 1408.

If a determination is made at step 1410 that programming is complete for a programmed state X on at least one of first plane α and second plane β, at step 1414 the program loop count $PL_{X\alpha}$ for state X on plane α, and program loop count $PL_{X\beta}$ for state X on plane β are determined. This step is performed for every programmed state X that passed verification at step 1408.

So for example, if a determination is made at step 1410 that programming is complete for programmed states S1 and S2 on first plane α, then at step 1414 the program loop counts $PL_{S1\alpha}$ and $PL_{S1\beta}$ and program loop counts $PL_{S2\alpha}$ and $PL_{S2\beta}$ and determined, and so on.

At step 1416, the loop delta between first plane α and second plane β for state X ($\Delta_{X\alpha\beta}$) is determined for all completed programmed states X. So in the example above, the loop delta $\Delta_{S1\alpha\beta}=(PL_{S1\alpha}$ and $PL_{S1\beta})$ and the loop delta $\Delta_{S2\alpha\beta}=(PL_{S2\alpha}$ and $PL_{S2\beta})$ are determined.

At step 1418, a determination is made for all completed programmed states X whether any loop delta $\Delta_{X\alpha\beta}$ is greater than the adaptive maximum loop delta limit $\delta_{MAX}(T_{OP})$ determined at step 1404.

If at step 1418 a determination is made that no loop delta $\Delta_{X\alpha\beta}$ is greater than the adaptive maximum loop delta limit $\delta_{MAX}(T_{OP})$, then an EPT status fail is not triggered, and at step 1412 multi-plane programming continues.

If at step 1418 a determination is made that at least one loop delta $\Delta_{X\alpha\beta}$ is greater than the adaptive maximum loop delta limit $\delta_{MAX}(T_{OP})$, then at step 1420 an EPT status fail is triggered and programming switches to single-plane programming. In an embodiment, programming of the slower plane ends and programming resumes on the other plane.

In an embodiment, the EPT process tracks and records the program loops taken by the fastest plane and makes sure the other planes don't exceed a predetermined delta in real time. In an embodiment, the EPT process does not necessarily wait for the other plane to finish programming that state. In an embodiment, if the delta is exceeded in real time the slower plane is isolated without waiting for the slower plane to complete programming.

Without wanting to be bound by any particular theory, it is believed that using an adaptive maximum loop delta limit $\delta_{MAX}(T_{OP})$ that varies based on chip temperature $T_{OP}$ may reduce EPT status fails and unnecessary termination of programming on defect-free and otherwise reliable blocks of memory cells.

One embodiment includes an apparatus that includes a control circuit coupled to a plurality of non-volatile memory cells. The control circuit is configured to perform a program-verify iteration on a first set of the non-volatile memory cells and a second set of the non-volatile memory cells in a plurality of program loops, determine that at least one of the first set of the non-volatile memory cells and the second set of the non-volatile memory cells passes verification to a programmed state in a first number of program loops, and compare a difference between the first number of program loops and the second number of program loops to an adaptive maximum loop delta limit. The adaptive maximum loop delta limit varies as a function of temperature.

One embodiment includes a method including concurrently programming non-volatile memory cells on a first plane and a second plane, determining that non-volatile memory cells on the first plane complete programming to a programmed state in a first number of program loops, determining that non-volatile memory cells on the second plane have been programmed to the programmed state in a second number of program loops, and determining whether a defect condition exists on the first plane or the second plane based on a difference between the first number of program loops and the second number of program loops and an adaptive maximum loop delta limit that varies with temperature.

One embodiment includes an apparatus that includes a plurality of non-volatile memory cells and a control circuit coupled to the non-volatile memory cells. The control circuit is configured to concurrently program a first set of the non-volatile memory cells on a first plane and a second set of the non-volatile memory cells on a second plane, determine that a difference between a first number of program loops used to complete programming the first set of the non-volatile memory cells to a programmed state and a second number of program loops used to program the second set of the non-volatile memory cells to the programmed state is less than or equal to an adaptive maximum loop delta limit that varies based on a temperature of the non-volatile memory cells, and determine that the second plane does not program more slowly than the first plane.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
   a control circuit coupled to a plurality of non-volatile memory cells, the control circuit configured to:
   perform a program-verify iteration on a first set of the non-volatile memory cells and a second set of the non-volatile memory cells in a plurality of program loops;
   determine that the first set of the non-volatile memory cells passes verification to a programmed state in a first number of program loops and that the second set of the non-volatile memory cells passes verification to the programmed state in a second number of program loops; and
   compare a difference between the first number of program loops and the second number of program loops to an adaptive maximum loop delta limit, wherein the adaptive maximum loop delta limit varies as a function of temperature.

2. The apparatus of claim 1, wherein the control circuit is further configured to:
   determine that the difference between the first number of program loops and the second number of program loops is less than or equal to the adaptive maximum loop delta limit; and
   continue programming the first set of the non-volatile memory cells and the second set of the non-volatile memory cells in the plurality of program loops.

3. The apparatus of claim 1, wherein the control circuit is further configured to:
   determine that the difference between the first number of program loops and the second number of program loops is greater than the adaptive maximum loop delta limit;
   terminate programming the second set of the non-volatile memory cells; and
   continue programming the first set of the non-volatile memory cells in the plurality of program loops.

4. The apparatus of claim 1, wherein the control circuit is further configured to:
   determine that the difference between the first number of program loops and the second number of program loops is greater than the adaptive maximum loop delta limit; and
   determine that a defect condition exists in the second set of the non-volatile memory cells.

5. The apparatus of claim 1, wherein the adaptive maximum loop delta limit varies linearly with temperature.

6. The apparatus of claim 1, wherein the adaptive maximum loop delta limit varies non-linearly with temperature.

7. The apparatus of claim 1, wherein the adaptive maximum loop delta limit varies in a piecewise-linear manner with temperature.

8. The apparatus of claim 1, wherein the control circuit is further configured to:
   program a first plane and a second plane of the non-volatile memory cells; and
   determine that a defect condition exists if the first plane programs slower than the second plane by the adaptive maximum loop delta limit.

9. The apparatus of claim 1, wherein the first set of the non-volatile memory cells comprise a first plane and the second set of the non-volatile memory cells comprise a second plane.

10. The apparatus of claim 1, wherein the control circuit is further configured to concurrently program the first set of the non-volatile memory cells and the second set of the non-volatile memory cells.

11. The apparatus of claim 1, wherein the plurality of non-volatile memory cells comprise a memory die, and the control circuit is further configured to:
   determine a temperature at one or more locations on the memory die; and
   determine the adaptive maximum loop delta limit based on the determined temperature.

12. The apparatus of claim 1, wherein the plurality of non-volatile memory cells comprise a memory die, and the control circuit is further configured to:

determine an average or median temperature at one or more locations on the memory die; and determine the adaptive maximum loop delta limit based on the determined temperature.

13. The apparatus of claim 1, wherein the plurality of non-volatile memory cells are arranged in a three dimensional structure.

14. A method comprising:

concurrently programming non-volatile memory cells on a first plane and a second plane;

determining that non-volatile memory cells on the first plane complete programming to a programmed state in a first number of program loops;

determining that non-volatile memory cells on the second plane have been programmed to the programmed state in a second number of program loops; and determining whether a defect condition exists on the first plane or the second plane based on a difference between the first number of program loops and the second number of program loops and an adaptive maximum loop delta limit that varies with temperature.

15. The method of claim 14, further comprising:

determining that the difference between the first number of program loops and the second number of program loops is less than or equal to the adaptive maximum loop delta limit; and continuing to concurrently program the non-volatile memory cells on the first plane and the second plane.

16. The method of claim 14, further comprising:

determining that the difference between the first number of program loops and the second number of program loops is greater than the adaptive maximum loop delta limit;

terminating programming the non-volatile memory cells on the second plane; and continuing to program the non-volatile memory cells on the first plane.

17. The method of claim 14, wherein the adaptive maximum loop delta limit varies linearly with temperature.

18. The method of claim 14, wherein the adaptive maximum loop delta limit varies non-linearly with temperature.

19. The method of claim 14, wherein the adaptive maximum loop delta limit varies in a piecewise-linear manner with temperature.

20. An apparatus comprising:

a plurality of non-volatile memory cells; and a control circuit coupled to the non-volatile memory cells, the control circuit configured to:

concurrently program a first set of the non-volatile memory cells on a first plane and a second set of the non-volatile memory cells on a second plane;

determine that a difference between a first number of program loops used to complete programming of the first set of the non-volatile memory cells to a programmed state and a second number of program loops used to program the second set of the non-volatile memory cells to the programmed state is less than or equal to an adaptive maximum loop delta limit that varies based on a temperature of the non-volatile memory cells; and determine that the second plane does not program more slowly than the first plane.

* * * * *